(12) United States Patent
Nomura et al.

(10) Patent No.: US 9,353,449 B2
(45) Date of Patent: May 31, 2016

(54) METHOD FOR PRODUCING NBON FILM

(75) Inventors: Takaiki Nomura, Osaka (JP); Takahiro Suzuki, Osaka (JP); Nobuhiro Miyata, Osaka (JP); Kazuhito Hato, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 268 days.

(21) Appl. No.: 13/876,684

(22) PCT Filed: Aug. 1, 2012

(86) PCT No.: PCT/JP2012/004901
§ 371 (c)(1),
(2), (4) Date: Mar. 28, 2013

(87) PCT Pub. No.: WO2013/018366
PCT Pub. Date: Feb. 7, 2013

(65) Prior Publication Data
US 2013/0192984 A1  Aug. 1, 2013

(30) Foreign Application Priority Data
Aug. 2, 2011  (JP) ................. 2011-169238

(51) Int. Cl.
*B05D 5/12* (2006.01)
*C23C 16/00* (2006.01)
(Continued)

(52) U.S. Cl.
CPC ......... *C25B 11/0447* (2013.01); *C01B 13/0207* (2013.01); *C23C 16/308* (2013.01); *C23C 16/405* (2013.01); *C25B 1/003* (2013.01);
(Continued)

(58) Field of Classification Search
USPC ............. 427/126.3, 255.19, 255.28, 255.394
See application file for complete search history.

(56) References Cited

U.S. PATENT DOCUMENTS 4,701,008 A * 10/1987 Richard .................. G02F 1/035
  216/24
6,878,666 B2  4/2005 Domen et al.
(Continued)

FOREIGN PATENT DOCUMENTS

JP  51-123779  10/1976
JP  2002-066333  3/2002
(Continued)

OTHER PUBLICATIONS

Chiu, et al., "Syntheses and Characterization of Organoimido Complexes of Niobium(V); Potential CVD Precursors", Journal of the Chinese Chemical Society, vol. 45, No. 3, pp. 355-360, 1998.

*Primary Examiner* — Brian K Talbot
(74) *Attorney, Agent, or Firm* — Hamre, Schumann, Mueller & Larson, P.C.

(57) ABSTRACT

The NbON film of the present invention is a NbON film in which a photocurrent is generated by light irradiation. The NbON film of the present invention is desirably a single-phase film. The hydrogen generation device (600) of the present invention includes: an optical semiconductor electrode (620) including a conductor (621) and the NbON film (622) of the present invention disposed on the conductor (621); a counter electrode (630) connected electrically to the conductor (621); a water-containing electrolyte (640) disposed in contact with a surface of the NbON film (622) and a surface of the counter electrode (630); and a container (610) containing the optical semiconductor electrode (620), the counter electrode (630), and the electrolyte (640). In this device, hydrogen is generated by irradiating the NbON film (622) with light.

3 Claims, 13 Drawing Sheets

(51) Int. Cl.

| | | |
|---|---|---|
| *C25B 11/04* | (2006.01) | |
| *C01B 13/02* | (2006.01) | |
| *C23C 16/30* | (2006.01) | |
| *C23C 16/40* | (2006.01) | |
| *C25B 1/00* | (2006.01) | |
| *C25B 1/04* | (2006.01) | |
| *C25B 9/00* | (2006.01) | |
| *H01M 8/06* | (2016.01) | |
| *B01J 35/00* | (2006.01) | |

(52) U.S. Cl.
CPC ... *C25B1/04* (2013.01); *C25B 9/00* (2013.01); *H01M 8/0656* (2013.01); *B01J 35/004* (2013.01); *Y02E 60/364* (2013.01); *Y02E 60/368* (2013.01); *Y02E 60/50* (2013.01)

(56) References Cited

U.S. PATENT DOCUMENTS

| | | | |
|---|---|---|---|
| 7,670,712 B2 | 3/2010 | Ota et al. | |
| 8,236,146 B2 | 8/2012 | Nomura et al. | |
| 2005/0202171 A1* | 9/2005 | Shin | 427/248.1 |
| 2008/0081922 A1* | 4/2008 | Meiere | C07F 7/10 556/51 |
| 2009/0047466 A1* | 2/2009 | German et al. | 428/98 |
| 2010/0055310 A1* | 3/2010 | Merle et al. | 427/250 |
| 2011/0195574 A1* | 8/2011 | Blasco et al. | 438/680 |
| 2012/0237842 A1* | 9/2012 | Suzuki et al. | 429/423 |

FOREIGN PATENT DOCUMENTS

| | | |
|---|---|---|
| JP | 2005-161203 | 6/2005 |
| JP | 2006-131606 | 5/2006 |
| JP | 2010-505002 | 2/2010 |
| JP | 4494528 | 6/2010 |
| JP | 2011-011949 | 1/2011 |
| JP | 2011-183358 | 9/2011 |
| JP | 2012-114016 | 6/2012 |
| WO | 2008/039960 | 4/2008 |
| WO | 2012/090390 | 7/2012 |

\* cited by examiner

METHOD FOR PRODUCING NBON FILM

TECHNICAL FIELD

The present invention relates to a NbON film, a method for producing a NbON film, a hydrogen generation device using the NbON film, and an energy system including the hydrogen generation device.

BACKGROUND ART

There are conventionally known techniques for decomposing water into hydrogen and oxygen by irradiating a semiconductor material serving as an optical semiconductor with light (see, for example, Patent Literature 1). Patent Literature 1 discloses a technique in which an n-type semiconductor electrode and a counter electrode are disposed in an electrolyte and the surface of the n-type semiconductor electrode is irradiated with light to obtain hydrogen and oxygen from the surfaces of these electrodes. Specifically, the use of a $TiO_2$ electrode or the like as the n-type semiconductor electrode is described therein.

However, the sunlight utilization efficiency of the n-type semiconductor electrode disclosed in Patent Literature 1 is still not high enough. For example, since an anatase type $TiO_2$ electrode has a band gap of 380 nm, only about 1% of sunlight can be utilized.

In order to solve the above problem, it is proposed, for example, to use optical semiconductor materials with smaller band gaps. For example, Patent Literature 2 proposes the use of a NbON optical semiconductor obtained by calcining $Nb_2O_5$ in a high-temperature ammonia atmosphere. Since the NbON optical semiconductor has a smaller band gap of about 600 nm, the sunlight utilization efficiency can be increased. Patent Literature 3 discloses an electrode (electrode catalyst) containing a NbON optical semiconductor attached thereto. This electrode can also be used for photolysis of water.

CITATION LIST

Patent Literature

Patent Literature 1 JP 51 (1976)-123779 A
Patent Literature 2 JP 2002-066333 A
Patent Literature 3 JP 2005-161203 A

SUMMARY OF INVENTION

Technical Problem

However, there is still a demand for further improvement of conventional NbON optical semiconductors to achieve better optical semiconductor properties (higher quantum efficiency) for hydrogen production by decomposition of water.

It is therefore an object of the present invention to provide a NbON optical semiconductor in the form of a film having further improved optical semiconductor properties (quantum efficiency) for hydrogen production by decomposition of water compared to conventional NbON optical semiconductors.

Solution to Problem

The present invention provides a NbON film in which a photocurrent is generated by light irradiation.

Advantageous Effects of Invention

According to the present invention, NbON and a NbON film having improved optical semiconductor properties (quantum efficiency) for hydrogen production by decomposition of water can be provided by a simpler method.

DESCRIPTION OF EMBODIMENTS

Figure 1:
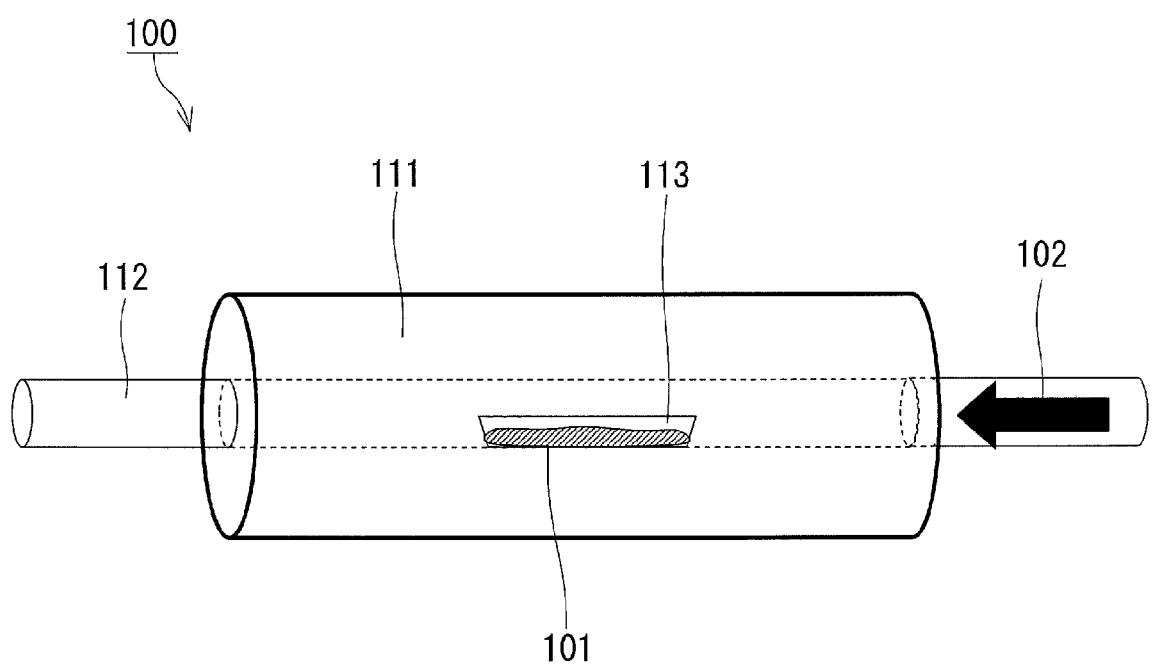
FIG. 1 is a schematic diagram showing an example of an apparatus for carrying out a NbON production method of a second embodiment of the present invention.

It is proposed to use optical semiconductor materials with smaller band gaps in a technique for producing hydrogen by decomposition of water under light irradiation. The present inventors have found that the conventionally proposed optical semiconductor materials described in "Background Art" have the following disadvantages.

For example, the NbON disclosed in Patent Literatures 2 and 3 has the disadvantage of being easily reduced when it is synthesized by the synthesis methods disclosed in Patent Literatures 2 and 3. Since not only NbON is produced but also NbN, a reduced species of Nb, is produced as a by-product in these synthesis methods, a single-phase or almost single-phase NbON material cannot be obtained. Therefore, it is difficult to make the NbON obtained by the synthesis methods disclosed in Patent Literatures 2 and 3 exhibit optical semiconductor properties sufficiently (high quantum efficiency) for hydrogen production by decomposition of water under light irradiation. Thus, the by-products such as NbN need to be dissolved in acid for removal from the resulting NbON.

In addition, even if a single-phase or almost single-phase NbON material is obtained by dissolving the by-products such as NbN in acid for removal from the NbON synthesized by the methods disclosed in Patent Literatures 2 and 3, a single-phase or almost single-phase NbON film cannot be obtained by the same methods. For example, when a commonly used film forming method was carried out using a single-phase or almost single-phase NbON material, a single-phase or almost single-phase NbON film could not be formed because impurities such as NbN were again produced from NbON in the film forming process. Specifically, the present inventors tried to form a film by sputtering using a single-phase or almost single-phase NbON material as a sputtering target. However, a single-phase or almost single-phase NbON film could not be obtained because NbON was decomposed by the energy applied to the NbON as the sputtering target during sputtering and thus by-products were produced. As another specific example, the present inventors prepared a suspension using a single-phase or almost single-phase NbON powder material, sprayed the suspension on a substrate to form a film, and calcined the film. However, NbON was oxidized during calcination, and thus a NbON film could not be obtained.

As a result of intensive studies, the present inventors have found a method for producing a NbON film containing a reduced amount of impurities such as by-products, and consequently provided a NbON film having improved optical semiconductor properties (quantum efficiency) for hydrogen production by decomposition of water under light irradiation and a method for producing the NbON film. In addition, the present inventors have provided a hydrogen generation device and an energy system each using this NbON film.

A first aspect of the present invention provides a NbON film in which a photocurrent is generated by light irradiation. In the present description, the phrase "a photocurrent is generated by light irradiation" means that "a photocurrent is generated at a photocurrent density of 0.1 mA/cm$^2$ or more by irradiation with sunlight".

Since the amount of impurities such as by-products mixed in the NbON film according to the first aspect is reduced, the NbON film allows NbON to exhibit optical semiconductor properties sufficiently (high quantum efficiency) for hydrogen production by decomposition of water under light irradiation.

A second aspect of the present invention provides a NbON film as set forth in the first aspect, wherein the NbON film is a single-phase film. According to the second aspect, a single-phase NbON film that has not been obtained before can be provided. Therefore, it is further ensured that this NbON film allows NbON to exhibit optical semiconductor properties sufficiently (high quantum efficiency) for hydrogen production by decomposition of water under light irradiation.

A third aspect of the present invention provides a NbON film as set forth in the first or second aspect, wherein the NbON film is formed by bringing, into contact with a heated substrate, vaporized $R^1N\!=\!Nb(NR^2R^3)_3$ (where $R^1$, $R^2$, and $R^2$ are each independently a hydrocarbon group) and at least either one selected from oxygen and water vapor. The amount of impurities such as by-products in the NbON film formed in this manner is sufficiently reduced. Therefore, it is further ensured that this NbON film allows NbON to exhibit optical semiconductor properties sufficiently (high quantum efficiency) for hydrogen production by decomposition of water under light irradiation.

A fourth aspect of the present invention provides a NbON film as set forth in the third aspect, wherein $R^1$ is a tertiary butyl group ($-C(CH_3)_3$), and $R^2$ and $R^3$ are each independently a straight-chain alkyl group (n-$C_nH_{2n+1}$, where n is an integer of 1 or more). This NbON film is highly crystalline and thus can exhibit much better optical semiconductor properties.

A fifth aspect of the present invention provides a method for producing a NbON film. This method includes the steps of (I) vaporizing $R^1N\!=\!Nb(NR^2R^3)_3$ (where $R^1$, $R^2$, and $R^3$ are each independently a hydrocarbon group); and (II) bringing, into contact with a heated substrate, the vaporized $R^1N\!=\!Nb(NR^2R^3)_3$ and at least either one selected from oxygen and water vapor.

According to the production method according to the fifth aspect, a NbON film containing a reduced amount of impurities such as by-products can be synthesized by fewer steps than conventional methods. Therefore, this production method makes it possible to provide a NbON film having improved optical semiconductor properties (quantum efficiency) for hydrogen production by decomposition of water by a simpler method.

A sixth aspect of the present invention provides a method for producing a NbON film as set forth in the fifth aspect, wherein in the step (II), the substrate is heated to a temperature that is equal to or higher than a boiling point of the $R^1N\!=\!Nb(NR^2R^3)_3$ and is equal to or lower than a decomposition temperature of the $R^1N\!=\!Nb(NR^2R^3)_3$. Heating of the substrate at temperatures in this range makes it possible to synthesize NbON with the production of by-products reduced, and therefore makes it easier to synthesize a single-phase NbON film. Thus, according to this production method, a single-phase NbON film can be obtained without carrying out a step of removing impurities.

A seventh aspect of the present invention provides a method for producing a NbON film as set forth in the fifth or sixth aspect, wherein $R^1$ is a tertiary butyl group ($-C(CH_3)_3$), and $R^2$ and $R^3$ are each independently a straight-chain alkyl group (n-$C_nH_{2n+1}$, where n is an integer of 1 or more). Since the material in which $R^1$ is a tertiary butyl group ($-C(CH_3)_3$), and $R^2$ and $R^3$ are each independently a straight-chain alkyl group (n-$C_nH_{2n+1}$, where n is an integer of 1 or more) is easily vaporized and has high heat resistance, it can be synthesized at higher temperatures. As a result, a highly crystalline single-phase NbON film having much better optical semiconductor properties can be synthesized more easily.

An eighth aspect of the present invention provides a hydrogen generation device including an optical semiconductor electrode including a conductor and the NbON film according to any one of the first to fourth aspects disposed on the conductor; a counter electrode connected electrically to the conductor; a water-containing electrolyte disposed in contact with a surface of the NbON film and a surface of the counter electrode; and a container containing the optical semiconductor electrode, the counter electrode, and the electrolyte. In this device, hydrogen is generated by irradiating the NbON film with light.

The hydrogen generation device according to the eighth aspect uses the NbON film according to any one of the first to fourth aspects having excellent optical semiconductor properties. Therefore, the hydrogen generation device according to the eighth aspect can also use light in the longer wavelength region, and thus the sunlight utilization efficiency can be increased.

A ninth aspect of the present invention provides an energy system including: the hydrogen generation device according to the eighth aspect; a hydrogen storage connected to the hydrogen generation device by a first pipe and configured to store the hydrogen generated in the hydrogen generation device; and a fuel cell connected to the hydrogen storage by a second pipe and configured to convert the hydrogen stored in the hydrogen storage into electricity and heat.

The energy system according to the ninth aspect includes the hydrogen generation device using the NbON film according to any one of the first to fourth aspects having excellent optical semiconductor properties. Therefore, the energy system according to the ninth aspect can also use light in the longer wavelength region, and thus the sunlight utilization efficiency can be increased.

Hereinafter, embodiments of the present invention are described in detail with reference to the drawings. The following embodiments are merely examples, and the present invention is not limited to these embodiments. In the following embodiments, the same parts are designated by the same numerals, and the same description may be omitted.

First Embodiment

An embodiment of the NbON film of the present invention is described. The NbON film of the present embodiment is a NbON film in which a photocurrent is generated by light irradiation. As described above, the phrase "a photocurrent is generated by light irradiation" means that "a photocurrent is generated at a photocurrent density of 0.1 mA/cm$^2$ or more by irradiation with sunlight".

The NbON film of the present embodiment is a film containing less impurities mixed, that is, a single-phase or almost single-phase NbON film. Therefore, the NbON film allows NbON to exhibit optical semiconductor properties sufficiently (high quantum efficiency) for hydrogen production by decomposition of water under light irradiation. It is desirable that the NbON film be a single-phase film to achieve high quantum efficiency more reliably.

Here, in the present description, the phrase "a NbON film is a single-phase film" means that the NbON film consists essentially of a NbON compound phase or the NbON film consists of a NbON compound phase. The phrase "the NbON film consists essentially of a NbON compound phase" means that the content of compound phases other than the NbON compound phase in the NbON film is 10 at. % or less, desirably 5 at. % or less, and more desirably 3 at. % or less. Even if the NbON film of the present embodiment is a single-phase film, it may contain a doping level of carbon atoms derived from hydrocarbon groups contained in the starting material used for the formation of the NbON film, but this causes no problem. As used herein, "a single phase film containing a doping level of other elements" refers to a single phase film containing the other elements at a concentration of 1 at. % or less in addition to the constituent elements of the single phase. An easy means for determining whether the NbON film is a single-phase film or not is, for example, to regard, as a single-phase film, a film having a single-phase NbON spectrum in the XPS spectrum of Nb3d. When the film is regarded as a single-phase film through the means, the film is made of single-phase NbON in terms of a Nb compound, but carbon derived from the starting material may be detected therein as long as the carbon content is in the above range.

The NbON film of the present embodiment may be a film formed by, for example, bringing, into contact with a heated substrate, vaporized $R^1N{=}Nb(NR^2R^3)_3$ (where $R^1$, $R^2$, and $R^3$ are each independently a hydrocarbon group) and at least either one selected from oxygen and water vapor. In this case, $R^1$ may be a tertiary butyl group (—C(CH$_3$)$_3$), and $R^2$ and $R^3$ may each independently be a straight-chain alkyl group (n-C$_n$H$_{2n+1}$, where n is an integer of 1 or more).

The production method of the NbON film of the present embodiment is not particularly limited, and the NbON film can be produced in a simple manner by a production method described later.

Second Embodiment

An embodiment of the NbON production method of the present invention is described below.

The NbON production method of the present embodiment includes a step of heating $R^1N{=}Nb(NR^2R^3)_3$ (where $R^1$, $R^2$, and $R^3$ are each independently a hydrocarbon group) in an atmosphere containing at least either one selected from oxygen and water. This step can be carried out using, for example, an apparatus 100 as shown in FIG. 1.

The apparatus 100 includes a tube furnace 111, a tube 112 penetrating the tube furnace 111, and a boat 113 placed in the tube 112. NbON (NbON powder) can be synthesized by heating a raw material ($R^1N{=}Nb(NR^2R^3)_3$) 101 set in the boat 113 in the tube 112, with an oxygen- and/or water-containing inert gas flow 102 in the tube 112. This method makes it possible to synthesize NbON having a reduced content of by-products such as NbN and thus to obtain a single-phase NbON material.

In the present embodiment, it is desirable that the raw material $R^1N{=}Nb(NR^2R^3)_3$ be heated at a temperature that is equal to or higher than a boiling point of the $R^1N{=}Nb(NR^2R^3)_3$ and is equal to or lower than a decomposition temperature of the $R^1N{=}Nb(NR^2R^3)_3$. Heating of the raw material in this temperature range makes it possible to synthesize NbON with the production of by-products reduced, and thus makes it easier to synthesize a single-phase NbON material (single-phase NbON powder). Therefore, a single-phase NbON material can be obtained without carrying out a step of removing impurities. The decomposition temperature of the material can be determined by TG-DTA measurement using an inert gas flow, DSC measurement in a sealed container, or the like.

In the $R^1N{=}Nb(NR^2R^3)_3$ used as the starting material, $R^1$, $R^2$, and $R^3$ are each independently a hydrocarbon group. Therefore, self-condensation reaction is inhibited in the $R^1N{=}Nb(NR^2R^3)_3$. As $R^1$, a branched-chain hydrocarbon group is suitable because the resulting material is a liquid and thus is easy to handle, is easily vaporized, easily undergoes a homogeneous reaction, and further has a higher decomposition temperature. In particular, a tertiary butyl group (—C(CH$_3$)$_3$) is desirable. As $R^2$ and $R^3$, straight-chain hydrocarbon groups are suitable because the resulting material has a higher decomposition temperature. Straight-chain alkyl groups (n-C$_n$H$_{2n+1}$, where n is an integer of 1 or more) like —CH$_3$ and C$_2$H$_5$ are desirable. Since a too long carbon chain causes the decomposition temperature to become too high, the carbon number is desirably 3 or less (n<3). Since the material in which $R^1$ is a tertiary butyl group (—C(CH$_3$)$_3$), and $R^2$ and $R^3$ are each independently a straight-chain alkyl group (n-C$_n$H$_{2n+1}$, where n is an integer of 1 or more) is easily vaporized and has high heat resistance, it can be synthesized at higher temperatures. As a result, highly crystalline single-phase NbON having better optical semiconductor properties can be synthesized more easily. It should be noted that the starting material used in the present embodiment is highly reactive with oxygen and water. Therefore, the content of oxygen and water in the starting material is desirably 1 mol ppm or less of the total amount of the starting amount, and more desirably 0.1 mol ppm or less.

As used in this description, the term "single-phase NbON" refers to a substance consisting essentially of a NbON compound phase or a substance consisting of a NbON compound phase. The phrase "the substance consists essentially of a NbON compound phase" means that the content of by-products other than the NbON compound phase in the substance is 10 at. % or less, desirably 5 at. % or less, and more desirably 3 at. % or less. Even if the substance obtained in the present embodiment is single-phase NbON, it may contain a doping level of carbon atoms derived from hydrocarbon groups contained in the starting material, but this causes no problem. As used herein, "a substance containing a doping level of other elements" refers to a substance containing the other elements at a concentration of 1 at. % or less in addition to the constituent elements of the single phase. An easy means for determining whether the NbON obtained by the production method of the present embodiment is a single-phase substance or not is, for example, to regard, as a single-phase substance, a substance having a single-phase NbON spectrum in the XPS spectrum of Nb3d. When the substance is regarded as a single-phase through the means, the substance is made of single-phase NbON in terms of a Nb compound, but carbon derived from the starting material may be detected therein as long as the carbon content is in the above range.

The inert gas used may be not only a so-called rare gas such as He, Ne, Ar, Kr, or Xe but also nitrogen gas. It is desirable to use a gas having a low content of oxygen and water. Therefore, the content of oxygen and water in the inert gas is desirably 10 vol. ppm or less, and more desirably 1 vol. ppm or less.

Any tube and any boat may be used as the tube 112 and the boat 113 in the tube furnace 111 as long as they withstand the operating temperatures and environments. However, since oxygen and/or water is introduced into the tube, quartz is suitably used for them because oxygen and water are less likely to be adsorbed on or desorbed from quartz.

Figure 2:
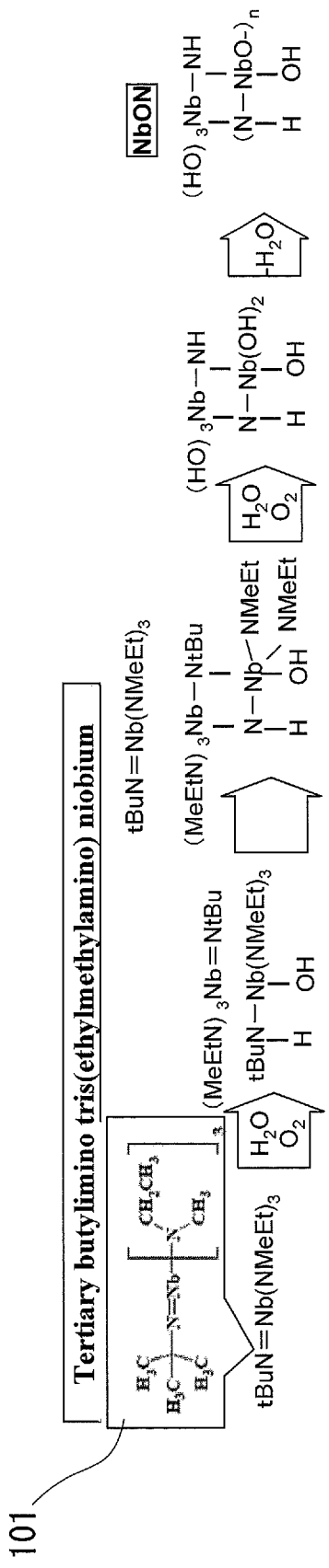
FIG. 2 is a diagram illustrating a NbON synthesis mechanism in the NbON production method of the second embodiment.

Next, the NbON synthesis mechanism in the production method of the present embodiment is described with reference to FIG. 2. Here, the case where tertiary butylimino tris(ethylmethylamino) niobium (tBuN=Nb(NMeEt)$_3$), where $R^1$ is a tertiary butyl group, $R^2$ is a methyl group, and $R^3$ is an ethyl group, is used as a raw material 101 is described as an example. A compound produced by binding of oxygen (O$_2$) or water (H$_2$O) to this raw material ($R^1$N=Nb(NR$^2$R$^3$)$_3$) 101 acts as an initiator and causes addition polymerization of $R^1$N=Nb(NR$^2$R$^3$)$_3$. Next, NR$^2$R$^3$ reacts with oxygen or water and then is condensation polymerized. Thus, a NbON powder is obtained. Since the production method of the present embodiment has such a reaction scheme, much less by-products are produced compared to partial nitridation of Nb$_2$O$_5$ with ammonia.

According to the production method of the present embodiment, NbON containing very little by-products or NbON containing no by-products can be synthesized. This means that there is no need to carry out a step of removing by-products, etc., and therefore single-phase NbON can also be produced by a simple one-step method. As a result, NbON having improved optical semiconductor properties (quantum efficiency) for hydrogen production by decomposition of water can be produced easily and inexpensively.

Third Embodiment

An embodiment of the NbON film production method of the present invention is described below.

Figure 3:
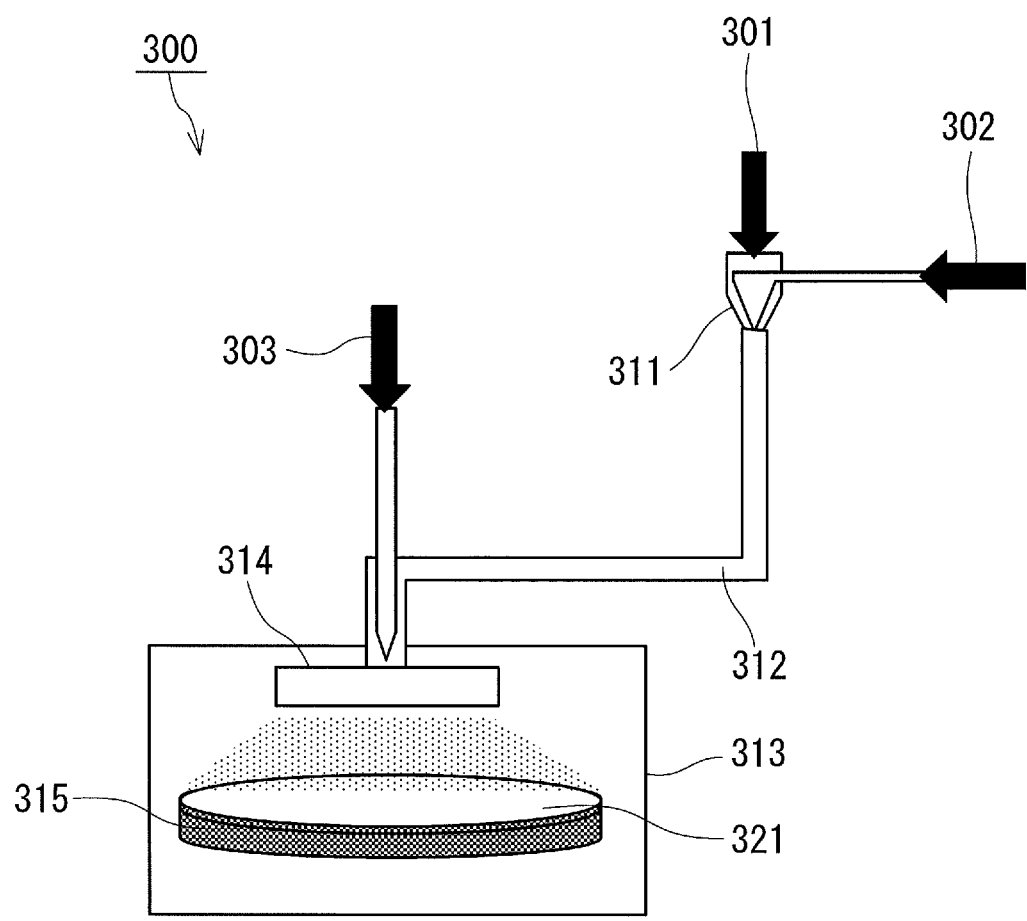
FIG. 3 is a schematic diagram showing an example of an apparatus for carrying out a NbON film production method of a third embodiment of the present invention.

The production method of the present embodiment includes the steps of (I) vaporizing $R^1$N=Nb(NR$^2$R$^3$)$_3$ (where $R^1$, $R^2$, and $R^3$ are each independently a hydrocarbon group); and (II) bringing, into contact with a heated substrate, the vaporized $R^1$N=Nb(NR$^2$R$^3$)$_3$ and at least either one selected from oxygen and water vapor. These steps can be carried out using, for example, a MOCVD (Metal-Organic Chemical Vapor Deposition) apparatus 300 as shown in FIG. 3. This method makes it possible to synthesize a NbON film having a reduced content of impurities such as NbN and thus to obtain a single-phase NbON film. Therefore, the NbON film described in the first embodiment can be produced by this method. In addition, this method makes it possible to produce a NbON film fixed to a substrate by chemical bonding. For example, in the case where a NbON film is formed by attaching NbON powder to an electrode, like the electrode catalyst described in Patent Literature 3, the NbON powder is only in contact with the electrode and is not attached firmly enough, which makes it difficult to obtain desired optical semiconductor properties (high quantum efficiency). In contrast, in the NbON film obtained by the method of the present embodiment, the NbON film is well fixed to the substrate, and thus this film allows NbON to exhibit its excellent optical semiconductor properties.

It is desirable that, in the step (II), the substrate be heated to a temperature that is equal to or higher than the boiling point of the $R^1$N=Nb(NR$^2$R$^3$)$_3$ as a raw material and is equal to or lower than the decomposition temperature of the $R^1$N=Nb (NR$^2$R$^3$)$_3$. Heating of the substrate at temperatures in this range makes it possible to synthesize NbON with the production of by-products reduced, and thus makes it easier to synthesize a single-phase NbON film. As a result, a single-phase NbON film that has not been obtained before can be obtained. It is desirable that, in the step (I), the raw material be vaporized at a temperature equal to or lower than the decomposition temperature thereof.

$R^1$N=Nb(NR$^2$R$^3$)$_3$ used as the starting material is the same as that described in the second embodiment. Therefore, detailed description thereof is omitted.

The MOCVD apparatus 300 includes a vaporizer 311, an inlet pipe 312, a reaction chamber 313, a shower head 314, and a susceptor 315. The vaporizer 311 vaporizes the raw material. The reaction chamber 313 is a chamber into which a source gas obtained by vaporizing the raw material in the vaporizer 311 is supplied to grow a crystal on the treatment surface of the substrate. The inlet pipe 312 supplies a gas such as a source gas to the reaction chamber 313 from the vaporizer 311. The shower head 314 is connected to the end of the inlet pipe 312. It is placed inside the reaction chamber 313 and injects a source gas, a reactant gas, etc. to the substrate to grow a crystal thereon. The susceptor 315 supports the substrate on which the crystal is to be grown and heats the substrate.

An inert gas 302 containing the raw material ($R^1$N=Nb (NR$^2$R$^3$)$_3$) 301 heated (desirably heated at a temperature equal to or lower than the decomposition temperature thereof) and vaporized in the vaporizer 311 is mixed with at least either one reactant gas 303 selected from oxygen and water vapor using the MOCVD apparatus 300. The mixed gas is injected from the shower head 314 to the substrate 321 heated by the susceptor 315. The temperature of the heated substrate 321 is desirably in the range of temperatures that are equal to or higher than the boiling point of the raw material 301 and are equal to or lower than the decomposition temperature thereof. In this temperature range, NbON can be deposited in the crystalline form on the substrate 321 so as to form a NbON film. The specific examples of the inert gas 302 used herein are the same as those of the inert gas used in the second embodiment.

It is desirable that the chamber wall of the MOCVD apparatus 300 be made of stainless steel because water and oxygen are less likely to be adsorbed on or desorbed from stainless steel. In order to prevent the attachment of $R^1$N=Nb (NR$^2$R$^3$)$_3$ on the chamber wall, a solution of the $R^1$N=Nb (NR$^2$R$^3$)$_3$ and an organic solvent may be vaporized. In this case, a nonaqueous solvent such as hydrocarbon, of which vaporization properties are similar to those of $R^1N\!=\!Nb(NR^2R^3)_3$ and in which $R^1N\!=\!Nb(NR^2R^3)_3$ dissolves, is suitable as the organic solvent. For example, ethylcyclohexane is suitably used.

Figure 4:
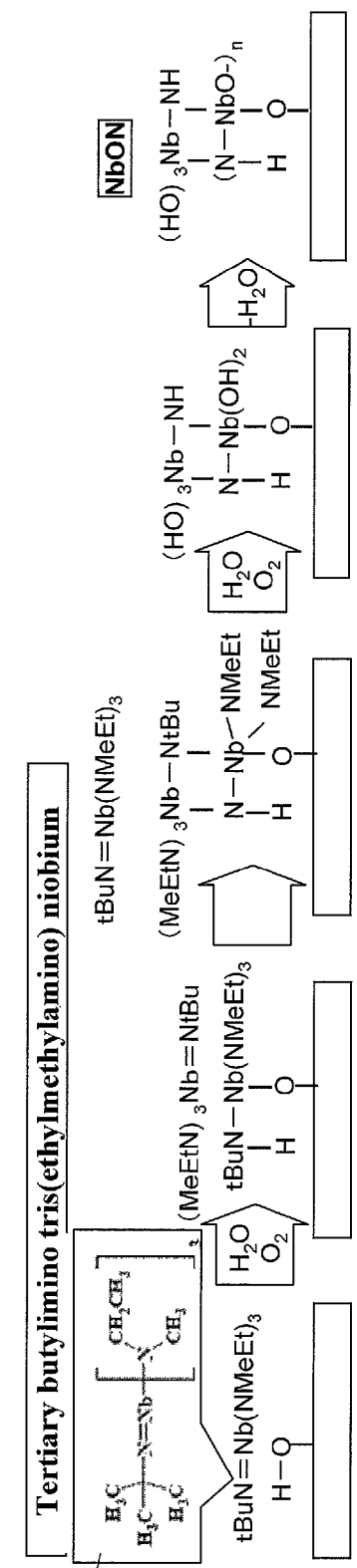
FIG. 4 is a diagram illustrating a NbON film synthesis mechanism in the NbON film production method of the third embodiment.

Next, the NbON film synthesis mechanism in the production method of the present embodiment is described with reference to FIG. 4. Here, the case where tertiary butylimino tris(ethylmethylamino) niobium (tBuN=Nb(NMeEt)$_3$), where $R^1$ is a tertiary butyl group, $R^2$ is a methyl group, and $R^3$ is an ethyl group, is used as a raw material 301 is described as an example. A compound produced by binding of this raw material ($R^1N\!=\!Nb(NR^2R^3)_3$) 301 to hydroxyl groups on the surface of the substrate 321 acts as an initiator and causes addition polymerization of $R^1N\!=\!Nb(NR^2R^3)_3$. Next, $NR^2R^3$ reacts with oxygen or water and then is condensation polymerized. Thus, a NbON film is obtained. Since the production method of the present embodiment has such a reaction scheme, much less by-products are produced compared to partial nitridation of Nb$_2$O$_5$ with ammonia.

The production method of the present embodiment makes it possible to synthesize a NbON film containing very little by-products or containing no by-products. This means that there is no need to carry out a step of removing by-products, etc., and therefore a single-phase NbON film can also be produced by a simple method. As a result, a NbON film having improved optical semiconductor properties (quantum efficiency) for hydrogen production by decomposition of water can be produced easily and inexpensively. In the case of a film, even if a step of removing impurities such as by-products is carried out additionally, it is difficult to remove by-products contained in the film. Therefore, even if a film containing NbON is produced by a commonly-used film formation method and a step of removing impurities from the film is carried out, it is difficult to obtain a NbON film containing very little or no by-products, such that a photocurrent is generated by light irradiation.

Fourth Embodiment

An embodiment of the hydrogen generation device of the present invention is described below with reference to FIG. 5.

A hydrogen generation device 500 of the present embodiment includes a water-containing electrolyte 510 in which the NbON material produced by the method described in the second embodiment is suspended, and a container 511 containing the electrolyte 510. This hydrogen generation device 500 decomposes water by irradiating the electrolyte 510 with light so as to generate hydrogen.

At least a portion (herein referred to as a light incident portion 512) of the container 511 is made of a material that transmits light such as sunlight so as to allow light such as sunlight to reach the inside of the container 511. The container 511 is further provided with an outlet 514 for discharging hydrogen and oxygen generated in the container 511 and an inlet 513 for supplying water to be decomposed into the container 511. The hydrogen generation device 500 further includes a hydrogen separation membrane 515, an oxygen outlet 516, and a hydrogen outlet 517. The hydrogen separation membrane 515 separates hydrogen from the gas discharged from the outlet 514. The hydrogen thus separated is discharged from the hydrogen outlet 517. After the hydrogen is separated, the remaining oxygen is discharged from the oxygen outlet 516.

Next, the operation of the hydrogen generation device 500 of the present embodiment is described with reference to FIG. 5.

The water-containing electrolyte 510 which is contained in the container 511 and in which the single-phase NbON material is suspended is irradiated with sunlight through the light incident portion 512 of the container 511 in the hydrogen generation device 500. In this case, electrons are generated in the conduction band of the NbON material in the electrolyte 510 and holes are generated in the valence band thereof. The holes thus generated decompose water and causes oxygen to be generated according to the reaction formula (1) below. On the other hand, the electrons causes hydrogen to be generated according to the reaction formula (2) below.

$$4h^+ + 2H_2O \rightarrow O_2\uparrow 4H^+ \tag{1}$$

$$4e^- + 4H^+ \rightarrow 2H_2\uparrow \tag{2}$$

The hydrogen and oxygen thus generated are discharged from the outlet 514 and then separated from each other through the hydrogen separation membrane 515. The oxygen and hydrogen are discharged from the oxygen outlet 516 and the hydrogen outlet 517, respectively. Water is supplied into the container 511 through the inlet 513 to replenish the water used for decomposition.

Since the NbON material used in the present embodiment is a material having excellent optical semiconductor properties, the probability of recombination of holes and electrons is low. Therefore, in the hydrogen generation device 500 of the present embodiment, the quantum efficiency of the hydrogen evolution reaction by light irradiation can be increased. In addition, since the NbON material used in the present embodiment has a small band gap, it is also responsive to visible light in sunlight. As a result, the hydrogen generation device 500 of the present embodiment can generate more hydrogen than a device using a conventional optical semiconductor material.

Fifth Embodiment

An embodiment of another hydrogen generation device of the present invention is described below with reference to FIG. 6.

A hydrogen generation device 600 of the present embodiment includes an optical semiconductor electrode 620 including a NbON film 622 described in the first embodiment, a counter electrode 630 that is an electrode paired with the optical semiconductor electrode 620, a water-containing electrolyte 640, and a container 610 containing the optical semiconductor electrode 620, the counter electrode 630, and the electrolyte 640.

The optical semiconductor electrode 620 includes a conductive substrate (conductor) 621 and the NbON film 622 formed on the conductive substrate 621.

In the container 610, the NbON film 622 of the optical semiconductor electrode 620 and the counter electrode 630 are disposed so that the surfaces thereof are in contact with the electrolyte 640. A portion of the container 610 that faces the NbON film 622 of the optical semiconductor electrode 620 disposed inside the container 610 (hereinafter, abbreviated as a light incident portion 611) is made of a material that transmits light such as sunlight.

The conductive substrate 621 of the optical semiconductor electrode 620 is connected electrically to the counter electrode 630 by a conducting wire 650. As used herein, the counter electrode refers to an electrode that can exchange electrons with an optical semiconductor electrode without an electrolyte. Accordingly, in the present embodiment, there is no particular limitation on the positional relationship, etc. of the counter electrode 630 with the optical semiconductor electrode 620, as long as the counter electrode 630 is connected electrically to the conductive substrate 621 that constitutes the optical semiconductor electrode 620. It should be noted that since the NbON film 622 used in the present embodiment is an n-type semiconductor, the counter electrode 630 serves as an electrode that receives electrons from the optical semiconductor electrode 620 without the electrolyte 640.

Figure 6:
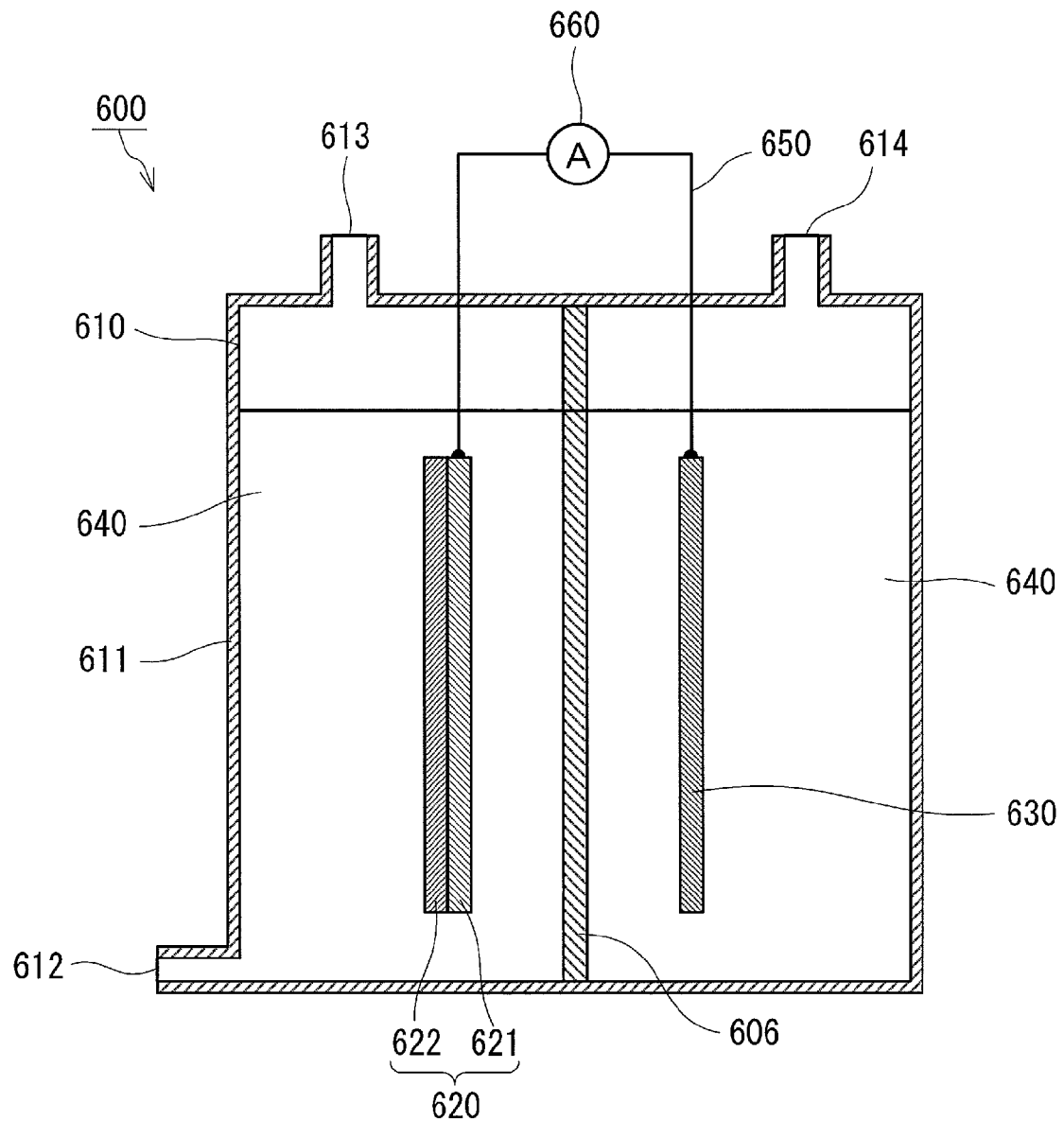
FIG. 6 is a schematic diagram showing a configuration of a hydrogen generation device of a fifth embodiment of the present invention.

As shown in FIG. 6, the hydrogen generation device 600 of the present embodiment further includes a separator 606. The separator 606 separates the inside of the container 610 into two regions: a region in which the optical semiconductor electrode 620 is disposed; and a region in which the counter electrode 630 is disposed. The electrolyte 640 is contained in both of these regions. The container 610 is provided with an oxygen outlet 613 for discharging oxygen generated in the region in which the optical semiconductor electrode 620 is disposed, and a hydrogen outlet 614 for discharging hydrogen generated in the region in which the counter electrode 630 is disposed. The container 610 is further provided with a water inlet 612 for supplying water into the container 610.

Next, the operation of the hydrogen generation device 600 of the present embodiment is described with reference to FIG. 6.

When the NbON film 622 of the optical semiconductor electrode 620 disposed in the container 610 is irradiated with sunlight through the light incident portion 611 of the container 610 in the hydrogen generation device 600, electrons are generated in the conduction band and holes are generated in the valence band, respectively, in the portion of the NbON film 622 irradiated with light. Since the NbON film 622 is an n-type semiconductor, the potential of the surface of the NbON film 622 is higher than the potential of the inside of the NbON film 622. Therefore, the holes generated at this time move to the surface of the NbON film 622 along the band edge of the valence band. Thus, water is decomposed on the surface of the NbON film 622 according to the above reaction formula (1), so that oxygen is generated. On the other hand, the electrons move from the surface near-field region of the NbON film 622 to the conductive substrate 621 through the inside of the single-phase NbON film along the band edge of the conduction band. When the electrons reach the conductive substrate 621, they are transferred, through the conducting wire 650, to the side of the counter electrode 630 connected electrically to the conductive substrate 621. Thus, hydrogen is generated on the surface of the counter electrode 630 according to the above reaction formula (2).

The oxygen and hydrogen thus generated are discharged from the oxygen outlet 613 and the hydrogen outlet 614, respectively. Water is supplied into the container 610 through the inlet 612 to replenish the water used for decomposition.

Since the NbON film used in the present embodiment is a material having excellent optical semiconductor properties, the probability of recombination of holes and electrons is low. Furthermore, the hydrogen generation device 600 of the present embodiment is a so-called photoelectrochemical cell using, as an electrode, a NbON film serving as an optical semiconductor. Therefore, in the hydrogen generation device 600, efficient charge separation between holes and electrons is achieved, and thus the quantum efficiency of the hydrogen evolution reaction by light irradiation is increased. In addition, since the single-phase NbON material has a small band gap, it is also responsive to visible light in sunlight. As a result, the hydrogen generation device 600 of the present embodiment can generate more hydrogen than a device using a conventional optical semiconductor material. Moreover, in the hydrogen generation device 600, hydrogen and oxygen can be generated separately, and thus it is easy to collect hydrogen and oxygen separately.

It is desirable that the portion of the conductive substrate 621 that is not covered with the NbON film 622 be covered, for example, with an insulating material such as resin. This covering prevents the uncovered portion of the conductive substrate 621 in the optical semiconductor electrode 620 from being dissolved in the electrolyte 640.

It is desirable to use a material with a low overvoltage for the counter electrode. For example, it is desirable to use a metal catalyst such as Pt, Au, Ag, Fe, or Ni as the counter electrode because the use thereof increases the reaction activity of the counter electrode. Any electrolyte can be used for the electrolyte 640 as long as it contains water. The water-containing electrolyte may be acidic or alkaline. In the case where a solid electrolyte is disposed between the optical semiconductor electrode 620 and the counter electrode 630, the electrolyte 640 in contact with the surface of the NbON film 622 of the optical semiconductor electrode 620 and the surface of the counter electrode 630 can be replaced by pure water for electrolysis.

Sixth Embodiment

Figure 7:
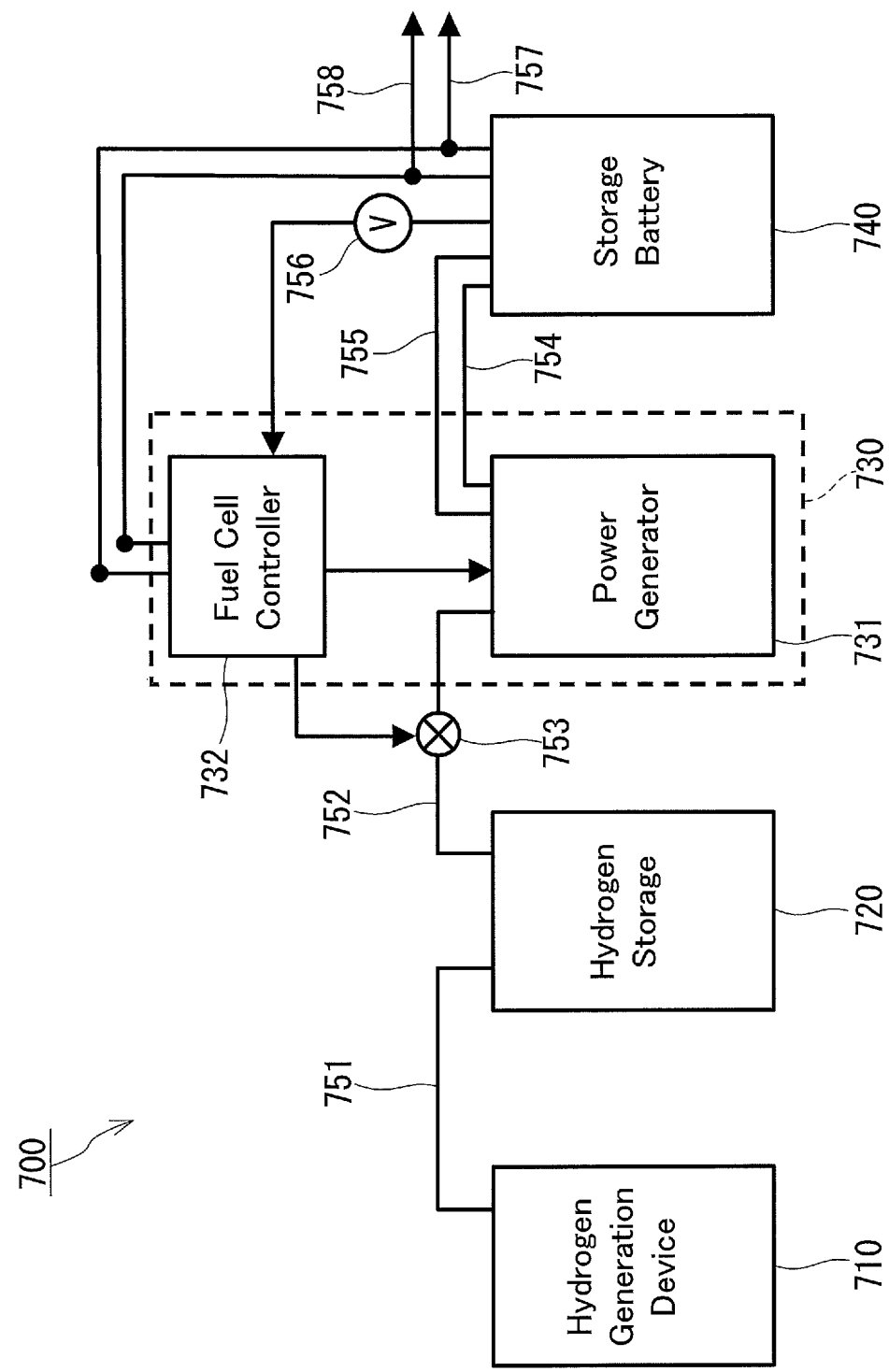
FIG. 7 is a schematic diagram showing a configuration of an energy system of a sixth embodiment of the present invention.

The configuration of an energy system of the fifth embodiment of the present invention is described with reference to FIG. 7. FIG. 7 is a schematic view showing the configuration of the energy system of the present embodiment.

As shown in FIG. 7, an energy system 700 of the present embodiment includes a hydrogen generation device 710, a hydrogen storage 720, a fuel cell 730, and a storage battery 740.

Figure 5:
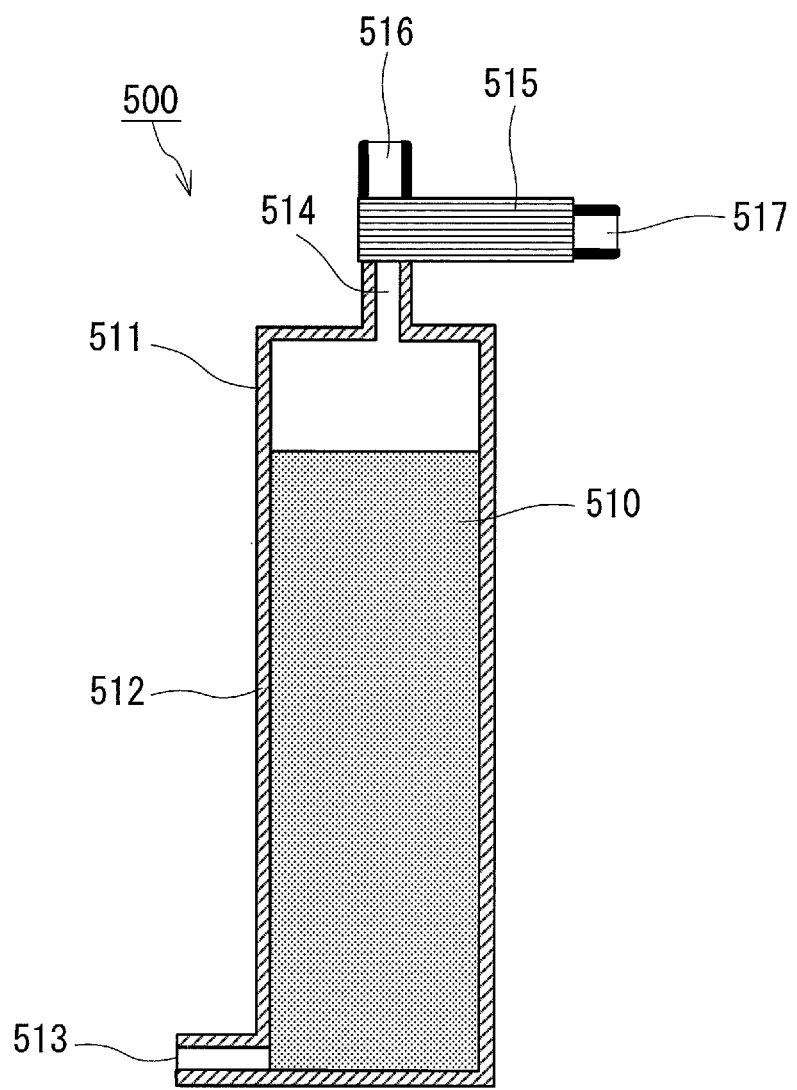
FIG. 5 is a schematic diagram showing a configuration of a hydrogen generation device of a fourth embodiment of the present invention.

The hydrogen generation device 710 is the hydrogen generation device 500 of the fourth embodiment or the hydrogen generation device 600 of the fifth embodiment, and specific configurations of these devices are as shown in FIG. 5 and FIG. 6, respectively. Therefore, detailed description thereof is omitted here.

The hydrogen storage 720 is connected to the hydrogen generation device 710 by a first pipe 751. The hydrogen storage 720 can be composed of, for example, a compressor for compressing hydrogen generated in the hydrogen generation device 710 and a high-pressure hydrogen tank for storing the hydrogen compressed by the compressor.

The fuel cell 730 includes a power generator 731 and a fuel cell controller 732 for controlling the power generator 731. The fuel cell 730 is connected to the hydrogen storage 720 by a second pipe 752. The second pipe 752 is provided with a block valve 753. For example, a solid polymer electrolyte fuel cell can be used as the fuel cell 730.

The positive electrode and the negative electrode of the storage battery 740 respectively are connected electrically to the positive electrode and the negative electrode of the power generator 731 in the fuel cell 730 by a first line 754 and a second line 755. The storage battery 740 is provided with a capacity meter 756 for measuring the remaining capacity of the storage battery 740. For example, a lithium ion battery can be used as the storage battery 740.

Next, the operation of the energy system 700 of the present embodiment is described by taking, as an example, the case where the hydrogen generation device 600 of the fifth embodiment is used as the hydrogen generation device 710, and also with reference to FIG. 6.

When the surface of the NbON film 622 of the optical semiconductor electrode 620 disposed inside the container 610 is irradiated with sunlight through the light incident portion 611 of the hydrogen generation device 600, electrons and holes are generated inside the NbON film 622. The holes generated at this time move to the surface side of the NbON film 622. Thus, water is decomposed on the surface of the NbON film 622 according to the above reaction formula (1), so that oxygen is generated.

On the other hand, the electrons move to the conductive substrate 621 along the bending of the band edge of the conduction band at the interface between the NbON film 622 and the conductive substrate 621. When the electrons reach the conductive substrate 621, they are transferred to the side of the counter electrode 630 through the conducting wire 650. Thus, hydrogen is generated on the surface of the counter electrode 630 according to the above reaction formula (2). As described in the fifth embodiment, in the hydrogen generation device 600, the quantum efficiency of the hydrogen evolution reaction by light irradiation is increased.

The oxygen thus generated is discharged from the oxygen outlet 613 to the outside of the hydrogen generation device 600. On the other hand, the hydrogen thus generated is supplied into the hydrogen storage 720 through the hydrogen outlet 614 and the first pipe 751.

In generating power in the fuel cell 730, the block valve 753 is opened according to signals from the fuel cell controller 732, so that the hydrogen stored in the hydrogen storage 720 is supplied to the power generator 731 of the fuel cell 730 through the second pipe 752.

The electricity generated in the power generator 731 of the fuel cell 730 is stored in the storage battery 740 through the first line 754 and the second line 755. The electricity stored in the storage battery 740 is supplied to home and business users through a third line 757 and a fourth line 758.

In the hydrogen generation device 600, the quantum efficiency of the hydrogen evolution reaction by light irradiation can be increased. Thus, the energy system 700 including this hydrogen generation device 600 can supply electric power efficiently.

In the present embodiment, the example of the energy system using the hydrogen generation device 600 described in the fifth embodiment is shown. However, even if the hydrogen generation device 500 described in the fourth embodiment is used, an energy system having the same effects can be obtained.

EXAMPLES

Hereinafter, examples of the present invention will be described in more detail.

Example 1

Synthesis of NbON Film

Figure 8:
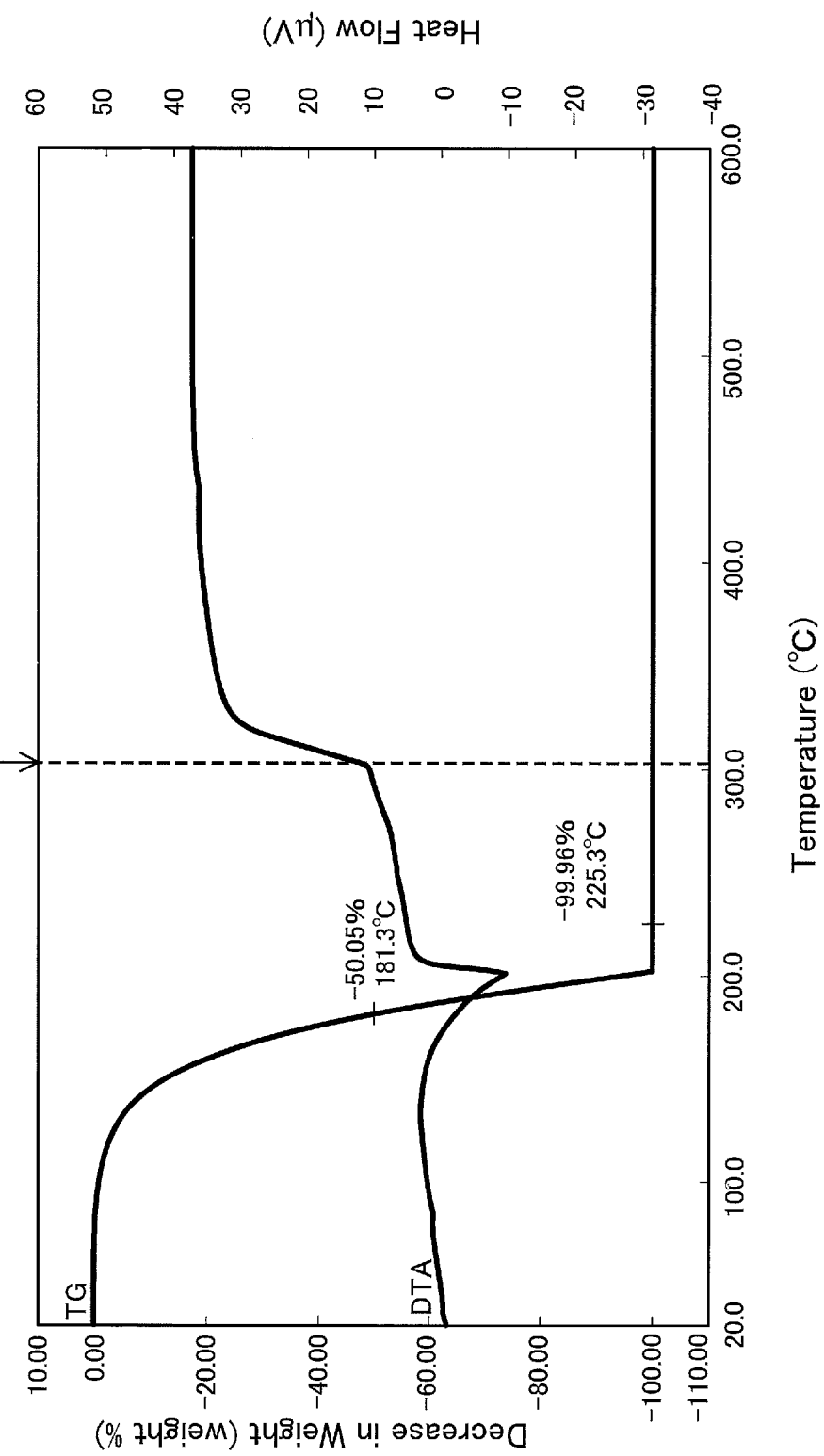
FIG. 8 shows TG-DTA (Thermogravimetry-Differential Thermal Analysis) data of a raw material used for NbON synthesis in Example 1.

As a raw material ($R^1N$=$Nb(NR^2R^3)_3$), tertiary butylimino tris(ethylmethylamino) niobium (($CH_3)_3CN$=$Nb(N(CH_3)C_2H_5)_3$) was used. FIG. 8 shows TG-DTA data of this raw material under an Ar flow. The boiling point of the material was about 181° C. The decomposition temperature of the residue of the material, which was believed to be the film of the material, was about 303° C.

Next, a single-phase NbON film was synthesized using the MOCVD apparatus 300 shown in FIG. 3. An ethylcyclohexane solution of the raw material 301 at $3.38 \times 10^{-5}$ Pa·m$^3$s$^{-1}$ (0.2 sccm) was vaporized at 150° C. in the vaporizer 311. Nitrogen gas 302 was used as an inert gas. Oxygen 303 at $1.69 \times 10^{-4}$ Pa·m$^3$s$^{-1}$ (1 sccm) was mixed with a mixed gas at $1.69 \times 10^{-4}$ Pa·m$^3$s$^{-1}$ (1000 sccm) containing the source gas (vaporized material 301) and the nitrogen gas 302. The resulting gas mixture was injected for 6 hours from the shower head 314 to the substrate 321 (ITO film (with a thickness of 150 nm)/glass substrate) heated at 300° C. by the susceptor 315. Thus, a film 1 with a thickness of 160 nm was obtained.

<Synthesis of Reference NbON Powder>

Figure 9:
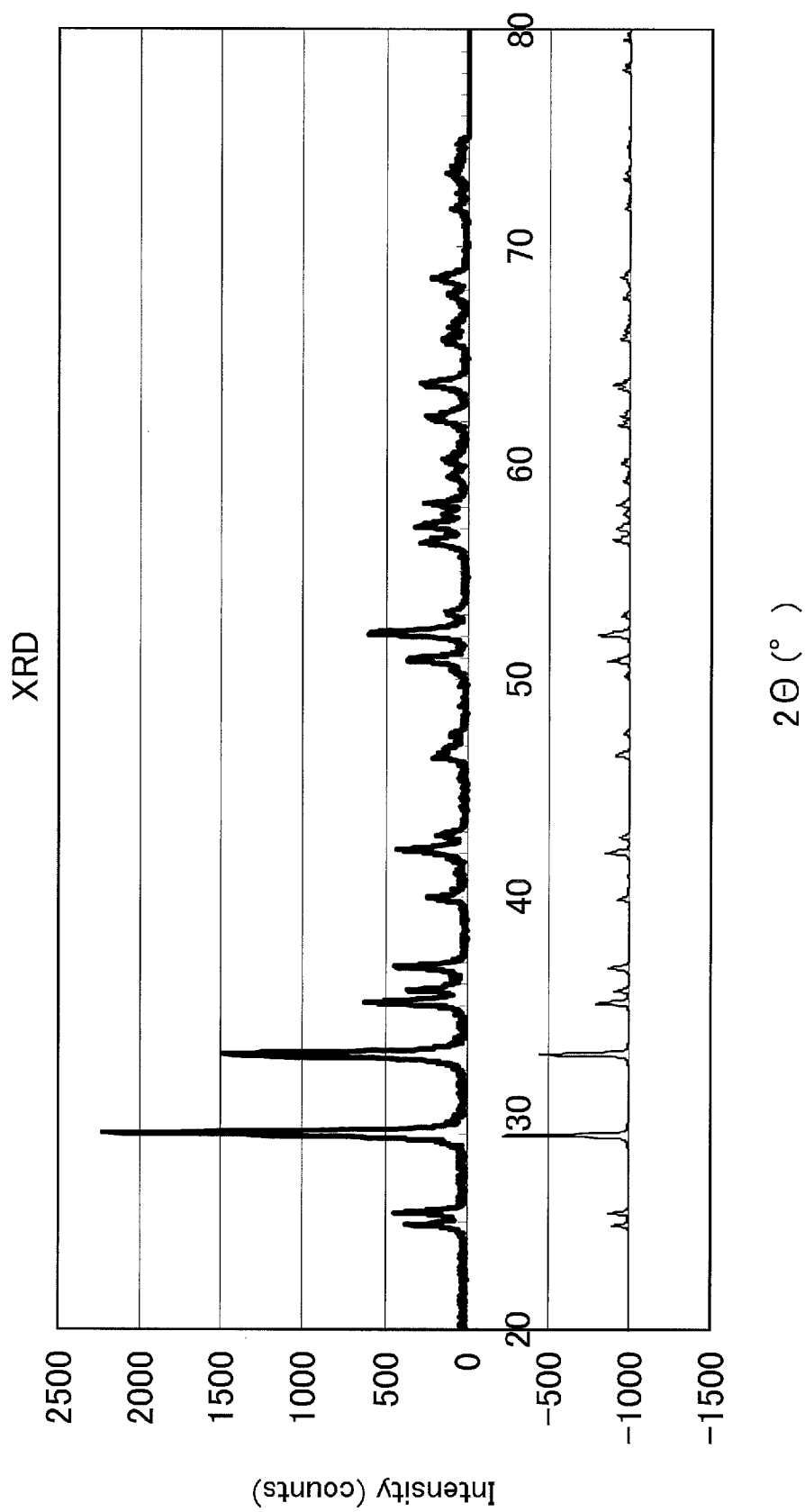
FIG. 9 shows XRD (X-ray Diffraction) data of a single-phase NbON powder 1 for comparison and XRD simulation data of NbON.

A reference NbON powder was synthesized using the apparatus shown in FIG. 1. 2 g of $Nb_2O_5$ as the raw material 101, instead of $R^1N$=$Nb(NR^2R^3)_3$, was set in the quartz boat 113 in the quartz tube 112 with an inner diameter of 25 mm of the tube furnace 111. This was heated at 650° C. for 4 hours under a $NH_3$ flow at $1.69 \times 10^{-1}$ Pa·m$^3$s$^{-1}$ (1000 sccm). NbN as an impurity was dissolved in 1N sulfuric acid so as to remove NbN from the resulting material. Thus, the powder 1 was obtained. FIG. 9 shows XRD data of the powder 1 (upper) and XRD simulation data of NbON (lower). As a result of a comparison of these XRD data, it was confirmed that the powder 1 was an almost single-phase NbON powder.

<Identification of Single-Phase NbON Film>

Figure 10:
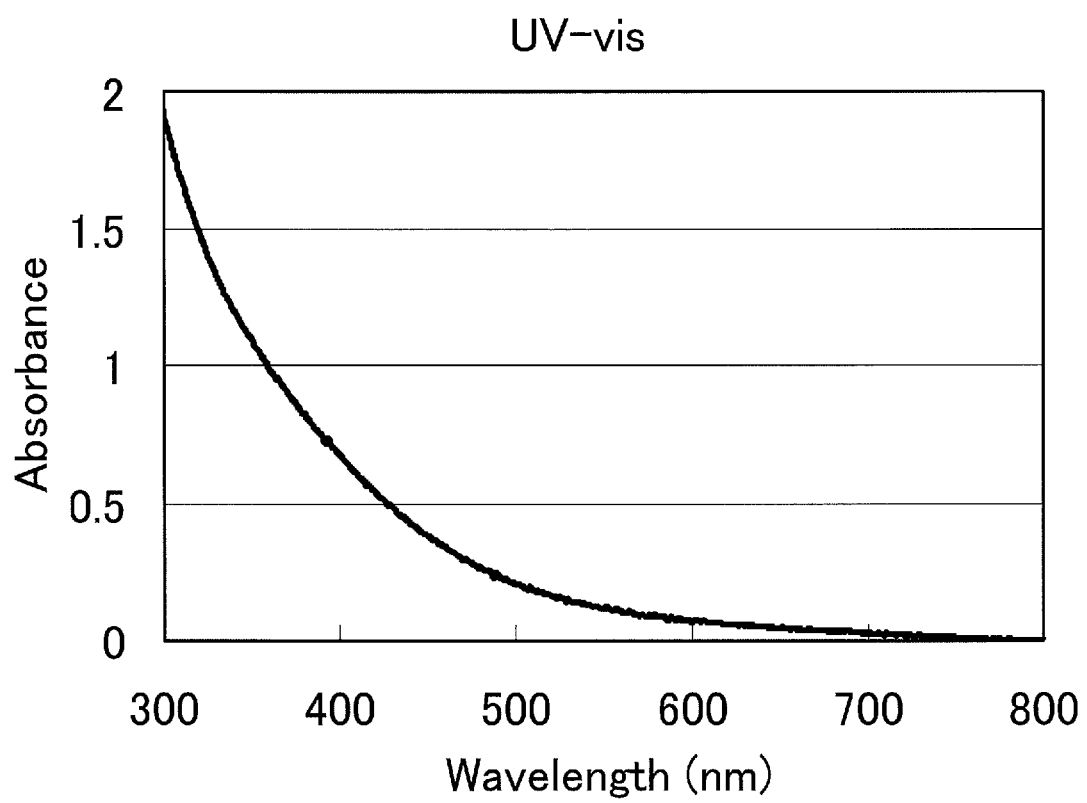
FIG. 10 shows UV-Vis (Ultraviolet Visible Absorption Spectroscopy) data of a film 1 of Example 1.
Figure 11:
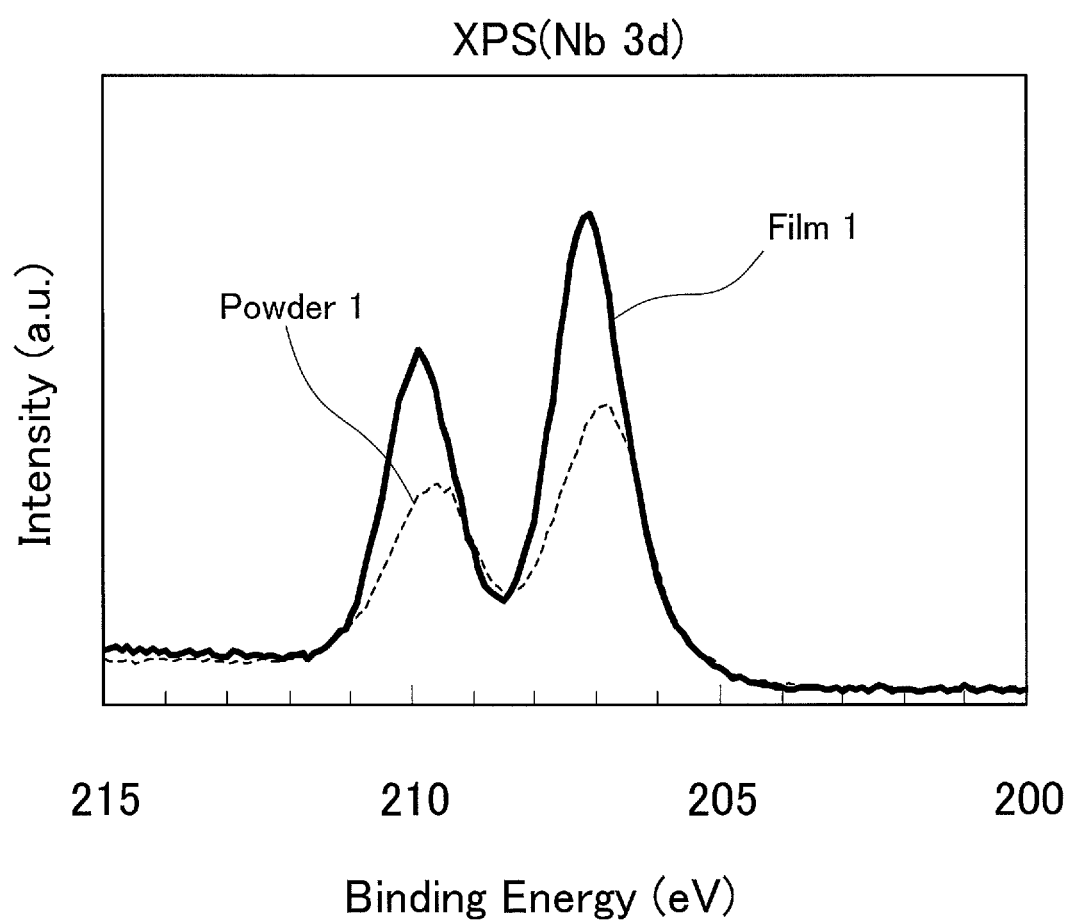
FIG. 11 shows XPS (X-ray Photoelectron Spectroscopy) data of Nb3d of the single-phase NbON powder 1 for comparison and that of the film 1.

FIG. 10 shows the UV-Vis spectrum of the film 1. FIG. 10 indicates that the band gap of the film 1 is 600 nm. This band gap almost coincides with the band gap of NbON reported in various documents. FIG. 11 shows the XPS spectrum of Nb3d of the film 1 and that of the powder 1 identified as a single-phase NbON material. FIG. 11 reveals that these spectra almost coincide with each other. As a result, it was confirmed that the film 1 was an almost single-phase NbON film.

In this example, the flow rate of oxygen during the synthesis of the single-phase NbON film was $1.69 \times 10^{-4}$ Pa·m$^3$s$^{-1}$ (1 sccm), and the gas concentration of oxygen with respect to nitrogen (inert carrier gas) was 0.1%. However, the synthesis of single-phase NbON films was also confirmed when the oxygen concentration was in the range of 0.01 to 1%.

Example 2

A NbON film was produced in the same manner as in Example 1 except that the temperature of the susceptor 315 was changed from 300° C. to 350° C. The thickness of the resulting NbON film (film 2) was 800 nm.

Figure 12:
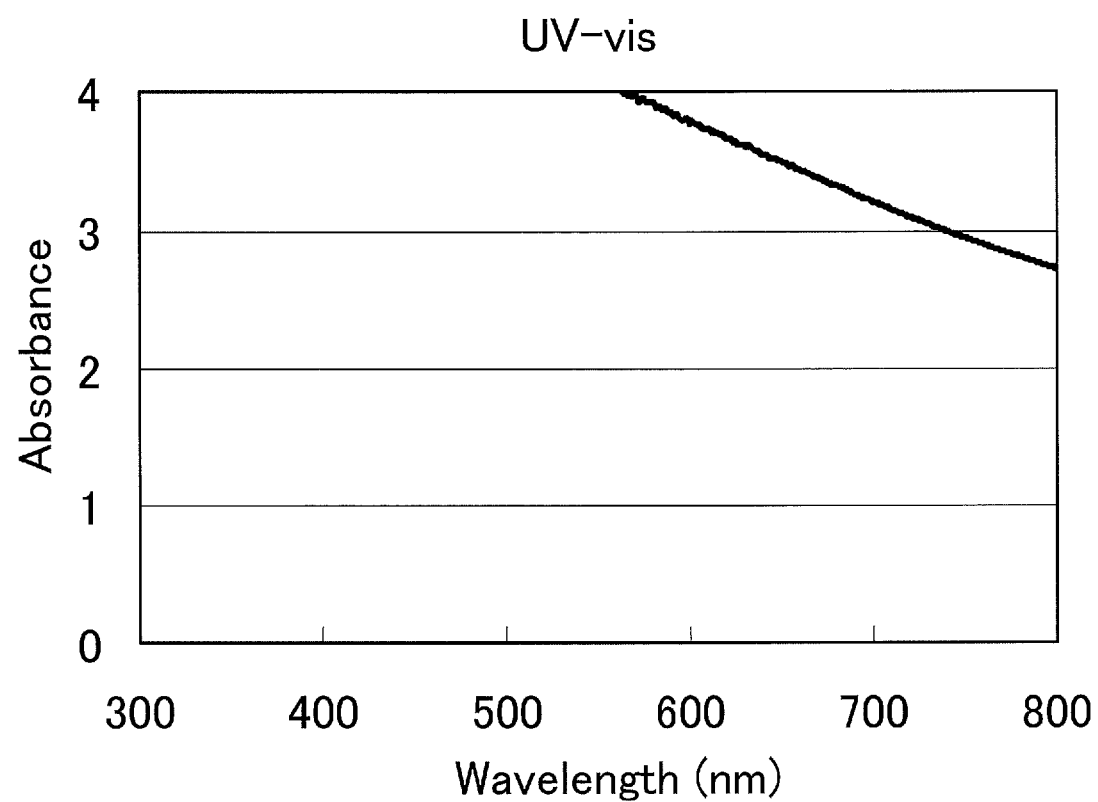
FIG. 12 shows UV-Vis data of a film 2 of Example 2.

FIG. 12 shows the UV-Vis spectrum of the film 2. Absorption was observed at all wavelengths and no band gap was found.

Figure 13:
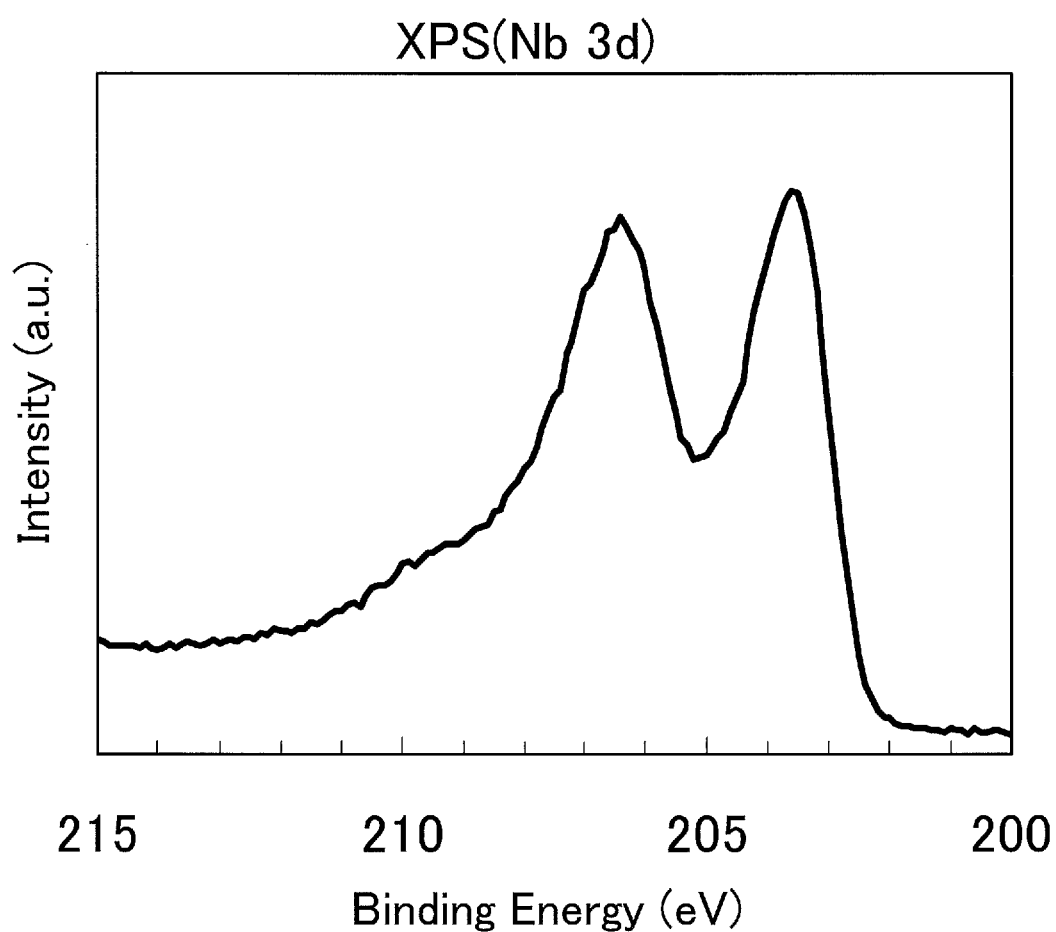
FIG. 13 shows XPS data of Nb3d of the film 2 of Example 2.

FIG. 13 shows the XPS spectrum of Nb3d of the film 2. The fact that the binding energy of the film 2 is 203.5 eV, which is different from the binding energy 206.8 eV of the film 1 (NbON), indicates that the film 2 contains NbN. However, the fact that a shoulder peak is also observed at 206.8 eV, which is the binding energy of the film 1, indicates that the film 2 also contains NbON.

Example 3

A single-phase NbON powder was synthesized using the apparatus 100 shown in FIG. 1. The raw material 101 was set in the quartz boat 113 in the quartz tube 112 with an inner diameter of 25 mm of the tube furnace 111. As the raw material 101, the same material as used in Example 1, i.e., tertiary butylimino tris(ethylmethylamino) niobium (($CH_3)_3CN$=$Nb(N(CH_3)C_2H_5)_3$) was used. This raw material 101 was heated at 300° C. for 4 hours under a flow of a gas mixture of nitrogen at $1.69 \times 10^{-1}$ Pa·m$^3$s$^{-1}$ (1000 sccm) and oxygen at $1.69 \times 10^{-4}$ Pa·m$^3$s$^{-1}$ (1 sccm). Thus, a powder 2 was obtained.

The XRD data of this powder 2 was compared with that of the powder 1 of Example 1. As a result, it was confirmed that these data almost coincided with each other. It was thus confirmed that the powder 2 was single-phase NbON powder.

In this example, the flow rate of oxygen during the synthesis of the single-phase NbON powder was $1.69 \times 10^{-4}$ Pa·m$^3$s$^{-1}$ (1 sccm), and the gas concentration of oxygen with respect to nitrogen (inert carrier gas) was 0.1%. However, the synthesis of single-phase NbON powders was also confirmed when the oxygen concentration was in the range of 0.01 to 1%.

Example 4

A NbON film was synthesized in the same manner as in Example 1 except that water vapor was used instead of oxygen used in Example 1. The thickness of the resulting NbON film (film 3) was 700 nm.

The XPS spectrum of Nb3d of this film 3 was measured. The measured spectrum was almost the same as that of the film 1. As a result, it was confirmed that the film 3 was a single-phase NbON film.

In this example, the flow rate of water vapor during the synthesis of the single-phase NbON film was $1.69 \times 10^{-4}$ Pa·m$^3$s$^{-1}$ (1 sccm), and the gas concentration of water vapor with respect to nitrogen (inert carrier gas) was 0.1%. However, the synthesis of single-phase NbON films was also confirmed when the water vapor concentration was in the range of 0.01 to 1%.

Example 5

As a raw material ($R^4N$=Nb(NR$^2$R$^3$)$_3$), tertiary butylimino tris(di-ethylamino) niobium (($CH_3$)$_3$CN=Nb(N($C_2H_5$)$_2$)$_3$) was used. The decomposition temperature of this material was determined based on the TG-DTA data thereof under an Ar flow. As a result, the decomposition temperature of this raw material was about 410° C.

Next, a single-phase NbON film was synthesized using the MOCVD apparatus 300 shown in FIG. 3. An ethylcyclohexane solution of the raw material 301 at $3.38 \times 10^{-5}$ Pa·m$^3$s$^{-1}$ (0.2 sccm) was vaporized at 150° C. in the vaporizer 311. Nitrogen gas 302 was used as an inert gas. Oxygen 303 at $1.69 \times 10^{-1}$ Pa·m$^3$s$^{-1}$ (1 sccm) was mixed with a mixed gas at $2.87 \times 10^{-4}$ Pa·m$^3$s$^{-1}$ (1700 sccm) containing the source gas (vaporized material 301) and the nitrogen gas 302. The resulting gas mixture was injected for 6 hours from the shower head 314 to the substrate 321 (ITO film (with a thickness of 150 nm)/glass substrate) heated at 400° C. by the susceptor 315. Thus, a film 4 with a thickness of 300 nm was obtained.

The XPS spectrum of Nb3d of this film 4 was measured. The measured spectrum was almost the same as that of the film 1. As a result, it was confirmed that the film 4 was an almost single-phase NbON film.

Example 6

As a raw material ($R^1N$=Nb(NR$^2$R$^3$)$_3$), tertiary butylimino tris(di-methylamino) niobium (($CH_3$)$_3$CN=Nb(N($CH_3$)$_2$)$_3$) was used. The decomposition temperature of this material was determined based on the TG-DTA data thereof under an Ar flow. As a result, the decomposition temperature of this raw material was about 250° C.

Next, a single-phase NbON film was synthesized using the MOCVD apparatus 300 shown in FIG. 3. An ethylcyclohexane solution of the raw material 301 at $3.38 \times 10^{-5}$ Pa·m$^3$s$^{-1}$ (0.2 sccm) was vaporized at 150° C. in the vaporizer 311. Nitrogen gas 302 was used as an inert gas. Oxygen 303 at $1.69 \times 10^{-1}$ Pa·m$^3$s$^{-1}$ (1 sccm) was mixed with a mixed gas at $2.87 \times 10^{-1}$ Pa·m$^3$s$^{-1}$ (1700 sccm) containing the source gas (vaporized material 301) and the nitrogen gas 302. The resulting gas mixture was injected for 6 hours from the shower head 314 to the substrate 321 (ITO film (with a thickness of 150 nm)/glass substrate) heated at 240° C. by the susceptor 315. Thus, a film 5 with a thickness of 300 nm was obtained.

The XPS spectrum of Nb3d of this film 5 was measured. The measured spectrum was almost the same as that of the film 1. As a result, it was confirmed that the film 5 was an almost single-phase NbON film.

Example 7

Production of Hydrogen Generation Device

As an example of the hydrogen generation device of the present invention, a hydrogen generation device having the same configuration as that of the hydrogen generation device 600 shown in FIG. 6 was produced. The configuration of the hydrogen generation device of the present embodiment is described with reference to FIG. 6.

As shown in FIG. 6, the hydrogen generation device 600 of Example 7 included a rectangular glass container 610 with an opening in the upper part, a semiconductor electrode 620 and a counter electrode 630. The glass container 610 contained 1 molL$^{-1}$ of H$_2$SO$_4$ aqueous solution as the electrolyte 640. As the optical semiconfuctor electrode 620, a 1-cm-square electrode having the substrate 321 (ITO film (with a thickness of 150 nm)/glass substrate) (corresponding to the conductive substrate 621) produced in Example 1, and the 160-nm-thick film 1 (corresponding to the NbON film 622) provided thereon was used. The optical semiconductor electrode 620 was disposed so that the surface of the NbON film 622 faced the light incident surface 611 of the glass container 610. A platinum plate was used as the counter electrode 630. The conductive substrate 621 of the optical semiconductor electrode 620 and the counter electrode 630 were electrically connected by the conducting wire 650. The current flowing between the optical semiconductor electrode 620 and the counter electrode 630 was measured with an ammeter 660.

<Simulated Sunlight Irradiation Experiment>

A solar simulator manufactured by SERIC Ltd. was used to apply simulated sunlight. The surface of the optical semiconductor electrode 620 was irradiated with light at an intensity of 1 kWm$^{-2}$ through the light incident portion 611 of the hydrogen generation device 600 of Example 7. The gas generated on the surface of the counter electrode 630 was collected for 60 minutes, and the components of the collected gas were analyzed and the amount of gas produced was measured by gas chromatography. The photocurrent flowing between the optical semiconductor electrode and the counter electrode was measured with the ammeter 660. The apparent quantum efficiency was calculated using the amount of gas produced in the counter electrode 630. About 30 µL of oxygen was generated from the optical semiconductor electrode 620, and about 60 µL of hydrogen was generated from the counter electrode 630. About 0.1 mA photocurrent was observed, and thus the calcualted apparent quantum efficiency was about 1%.

It was confirmed from these results that the single-phase NbON film used in this example had optical semiconductor properties for hydrogen generation by decomposition of water under light irradiation.

Example 8

A hydrogen generation device was produced in the same manner as in Example 7 except that the film 2 of Example 2 was used instead of the film 1 of Example 1, and a photocurrent was measured. A photocurrent with a photocurrent density of 0.1 mAcm$^{-2}$ derived from NbON was obtained, although the film 2 of Example 2 was not a single-phase film.

INDUSTRIAL APPLICABILITY

The NbON film of the present invention has excellent optical semiconductor properties for hydrogen production by decomposition of water under light irradiation. Therefore, the NbON film of the present invention is useful for various photocatalyst-related techniques.

The invention claimed is:

1. A method for producing a NbON film, the method comprising the steps of:
   (I) vaporizing $R^1N\!\!=\!\!Nb(NR^2R^3)_3$ (where $R^1$, $R^2$, and $R^3$ are each independently an alkyl group); and
   (II) bringing, into contact with a heated substrate, the vaporized $R^1N\!\!=\!\!Nb(NR^2R^3)_3$ and at least one selected from oxygen and water vapor,
   wherein in the step (II), the substrate is heated to a temperature that is equal to or higher than a boiling point of the $R^1N\!\!=\!\!Nb(NR^2R^3)_3$ and is equal to or lower than a decomposition temperature of the $R^1N\!\!=\!\!Nb(NR^2R^3)_3$,
   wherein the temperature of the substrate is 400° C. or less, and
   the content of compound phases other than the NbON compound phase in the NbON film is 10 at. % or less.

2. The method for producing a NbON film according to claim 1, wherein $R^1$ is a tertiary butyl group (—C(CH$_3$)$_3$), and $R^2$ and $R^3$ are each independently a straight-chain alkyl group (—C$_n$H$_{2n+1}$, where n is an integer of 1 or more).

3. The method for producing a NbON film according to claim 2, wherein $R^2$ and $R^3$ are selected from the group consisting of methyl and ethyl.

* * * * *